(12) United States Patent
Nayak et al.

(10) Patent No.: US 10,177,178 B1
(45) Date of Patent: Jan. 8, 2019

(54) ASSEMBLY OF CMOS DRIVER WAFER AND LED WAFER FOR MICRODISPLAY

(71) Applicant: GLOBALFOUNDRIES Inc., Grand Cayman (KY)

(72) Inventors: Deepak K. Nayak, Union City, CA (US); Srinivasa Banna, San Jose, CA (US)

(73) Assignee: GLOABLFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/642,017

(22) Filed: Jul. 5, 2017

(51) Int. Cl.
| | |
|---|---|
| H01L 27/14 | (2006.01) |
| H01L 27/12 | (2006.01) |
| G09G 3/32 | (2016.01) |
| H01L 33/32 | (2010.01) |
| H01L 29/49 | (2006.01) |
| H01L 29/66 | (2006.01) |

(52) U.S. Cl.
CPC .......... *H01L 27/1248* (2013.01); *G09G 3/32* (2013.01); *H01L 27/124* (2013.01); *H01L 33/32* (2013.01); *G09G 2330/02* (2013.01); *H01L 27/12* (2013.01); *H01L 29/4908* (2013.01); *H01L 29/66765* (2013.01)

(58) Field of Classification Search
CPC ..... H01L 25/50; H01L 27/156; H01L 25/167; H01L 27/1262; H01L 27/124; H01L 21/775; H01L 27/12; H01L 29/78621
USPC .......... 257/72, 59, 98, 90; 438/48, 128, 149, 438/151, 157
See application file for complete search history.

(56) References Cited

U.S. PATENT DOCUMENTS

| | | | |
|---|---|---|---|
| 8,241,932 B1* | 8/2012 | Yu .................. | H01L 25/0753 257/E21.122 |
| 8,933,473 B1* | 1/2015 | Dubin ............... | H01L 25/167 257/79 |
| 9,047,818 B1 | 6/2015 | Day et al. | |
| 2006/0197102 A1* | 9/2006 | Ogihara ............ | G03G 15/326 257/99 |
| 2017/0069609 A1* | 3/2017 | Zhang ............... | H01L 25/167 |
| 2017/0186907 A1* | 6/2017 | Chaji .............. | H01L 33/0037 |
| 2018/0102492 A1* | 4/2018 | Bibl ................ | H01L 27/156 |

OTHER PUBLICATIONS

Chang, Fabrication of a vertically-stacked passive-matrix micro-LED array structure for a dual color display, Journal, Feb. 6, 2017, p. 2489-2495, vol. 25, No. 3, Optics Express.

* cited by examiner

*Primary Examiner* — Thinh T Nguyen
(74) *Attorney, Agent, or Firm* — Yuanmin Cai; Hoffman Warnick LLC

(57) ABSTRACT

An integrated circuit (IC) microdisplay structure is disclosed. The structure can include: a first oxide layer positioned on a substrate; a first voltage source (VSS) pad within the first oxide layer; a metal pillar disposed within the first oxide layer and on the first VSS pad; a first gallium nitride layer disposed on the metal pillar and extending over the first oxide layer; and at least one subpixel formed from the first gallium nitride layer. Alternatively, the structure can include a first oxide layer positioned on a substrate; a first metal layer positioned on the first oxide layer; a first gallium nitride layer on the first metal layer; and at least one subpixel formed from the first gallium nitride layer. The structure may further include a subpixel driver electrically connected to the at least one subpixels where a portion of the subpixel driver is vertically aligned with a subpixel.

12 Claims, 9 Drawing Sheets

ASSEMBLY OF CMOS DRIVER WAFER AND LED WAFER FOR MICRODISPLAY

BACKGROUND

Technical Field

Aspects of the disclosure relate generally to integrated circuits (ICs). More specifically, embodiments of the present disclosure include an IC structure for a microdisplay device and a method for assembling the light emitting diode (LED) wafer and complimentary metal-oxide semiconductor (CMOS) driver wafer for the microdisplay.

Related Art

A microdisplay may include, for example, a display with a screen of less than two inches diagonally. The display may include series of colored lighted areas arranged in patterns which can be viewed together as an image using magnifying optics. The colored light areas may include an integrated circuit (IC) of hundreds of pixels, i.e., the smallest element of a picture on the screen. Each pixel may include three single-color elements or "subpixels," one for each of the color red, green and blue. The subpixels appear as a single color pixel in the image on the display. Each subpixel may be a microscopic light emitting diodes (LEDs), i.e. semiconductor light sources. In order to control the color of each pixel in the image on the microdisplay, each subpixel may be connected to a complimentary metal-oxide semiconductor (CMOS) driver circuit. In order to control power to the microdisplay, an input/output (I/O) driver is included in the integrated circuit of the microdisplay and connected to a voltage power source. Microdisplays may be used, for example, to displaying images for virtual reality (VR) simulations, or augmented reality (AR). In VR a computer-generated simulation of a three-dimensional image may be displayed by the microdisplay. In AR, a composite image of a computer-generated image superimposed on a user's view of the real world may be displayed by the microdisplay.

Integrated circuits (ICs) of a microdisplay device can be made up of billions of interconnected devices, such as drivers, transistors, resistors, capacitors, and diodes, located on one or more chips of semiconductor substrate material. For microdisplay devices used in virtual reality (VR) and augmented reality (AR) displays, for example, light emitting diode (LED) resolution may be as high as 8,000 by 8,000 pixels in a 1 inch by 1 inch display. Since each pixel includes three color subpixels, the required number of subpixels in the display is on the order of 48 million subpixels per square inch. Furthermore, as discussed above, each subpixel requires connection to a complimentary metal-oxide semiconductor (CMOS) driver of the IC. One method for fabricating and connecting the subpixels and CMOS driver(s) of a microdisplay structure includes forming the driver(s) in the IC structure, forming the subpixels in the IC structure, for example, adjacent to the driver(s) and electrically connecting the subpixels to a neighboring driver. Subpixel manufacturing and driver manufacturing require differing semiconductor manufacturing processes and the manufacturing of each component may affect the functionality of the other. Further, forming subpixels adjacent to the driver(s) in the IC may limit the number of components capable of fitting in a given region of the IC. Another method for fabricating and connecting the LED subpixels and CMOS driver(s) may include separately forming the subpixels in a first IC chip and the drivers in a second IC chip, and electrically connecting the subpixels to the driver(s) by combining the IC chips with electrical connectors therebetween. The materials used to connect the subpixels and driver(s) when the chips are combined may expand during the chip-combining process and may result in electrical failures in the display. Yet another method for fabricating and connecting LED subpixels and CMOS driver(s) includes forming the driver(s) using polysilicon in an IC structure, forming subpixels in the IC structure on the driver(s) and electrically connecting the subpixels to the driver(s). The use of polysilicon to form the driver(s) may, for example, require the capability to provide different processing conditions than those for traditional driver(s).

SUMMARY

A first aspect of the disclosure provides an integrated circuit (IC) microdisplay structure including: a first oxide layer positioned on a substrate; a first voltage source (VSS) pad within the first oxide layer; a metal pillar disposed within the first oxide layer and on the first VSS pad; a first gallium nitride layer disposed on the metal pillar and extending over the first oxide layer; and at least one subpixel formed from the first gallium nitride layer.

A second aspect of the disclosure provides an integrated circuit (IC) microdisplay structure including: a first oxide layer positioned on a substrate; a first metal layer positioned on the first oxide layer; a first gallium nitride layer on the first metal layer; and at least one subpixel formed from the first gallium nitride layer.

A third aspect of the disclosure provides a method of assembling a light emitting diode (LED) wafer and a complimentary metal-oxide semiconductor (CMOS) driver wafer for a microdisplay system, the method including: during a bonding of the CMOS driver wafer with the LED wafer, connecting a voltage source (VSS) pad to at least one subpixel of the LED wafer.

BRIEF DESCRIPTION OF THE DRAWINGS

The embodiments of this disclosure will be described in detail, with reference to the following figures, wherein like designations denote like elements, and wherein.

Figure 1:
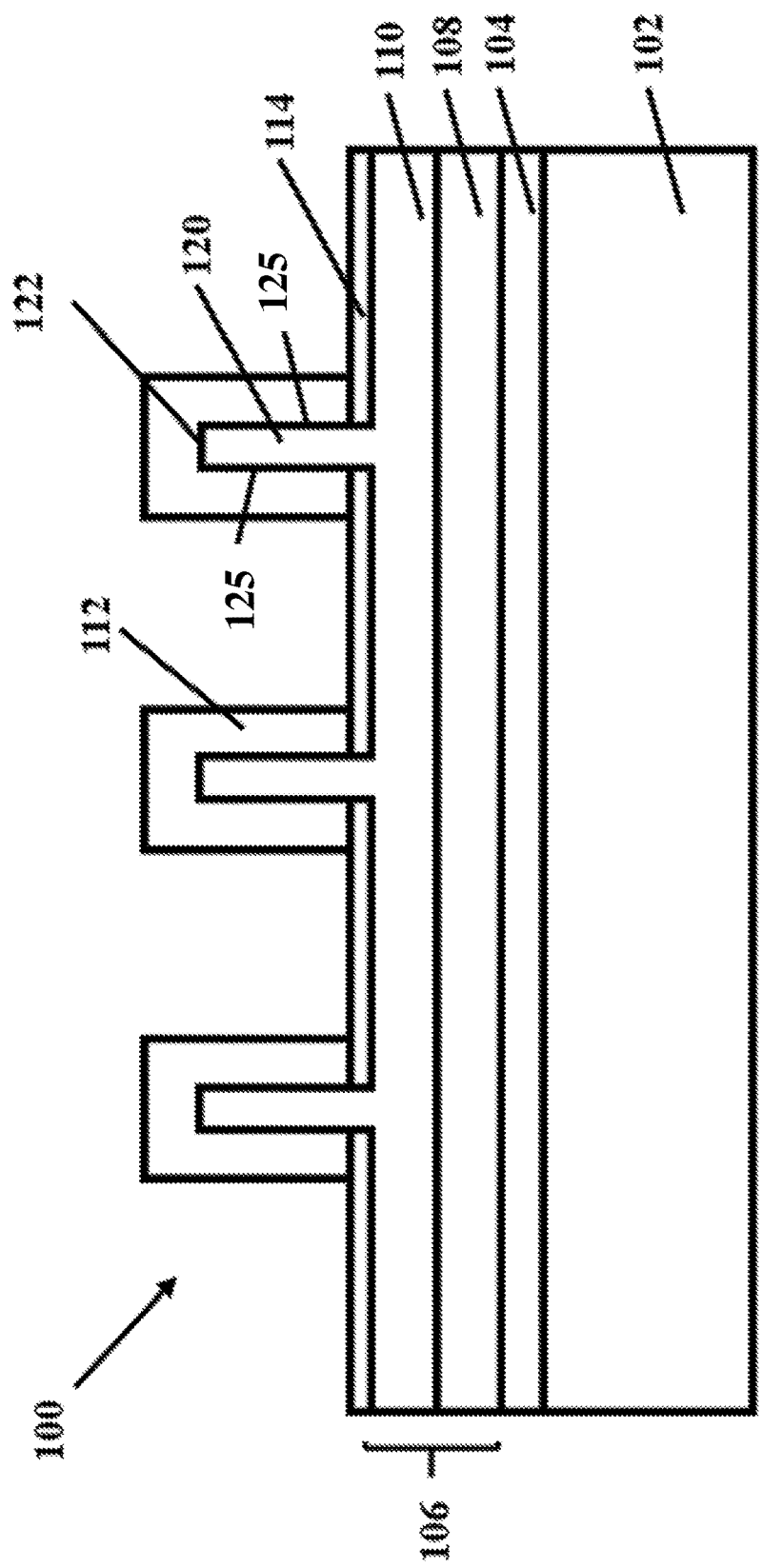
FIG. 1 shows a LED wafer, according to the prior art.

It is noted that the drawings of the disclosure are not to scale. The drawings are intended to depict only typical aspects of the disclosure, and therefore should not be considered as limiting the scope of the disclosure. In the drawings, like numbering represents like elements between the drawings. The drawings may be rotated in any direction and are not limited to a particular orientation.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a structure and method for forming an integrated circuit (IC) microdisplay structure from a complimentary metal-oxide semiconductor (CMOS) driver wafer and a light emitting diode (LED) wafer. Among other things, the IC microdisplay structure may include a metal pillar for electrically connecting a voltage source (VSS) pad to at least one subpixel of the LED wafer. In another embodiment, the IC microdisplay structure may include a VSS pad in the form of a metal layer on the LED wafer in electrical communication with the at least one subpixel. Methods for forming the IC microdisplay structure may include, among other things, connecting a voltage source (VSS) pad to at least one subpixel of an LED wafer during a bonding of the LED wafer to a CMOS driver wafer. The methods may also include, attaching a carrier wafer to the LED wafer and removing portions of the LED wafer before connecting the VSS pad and bonding the LED wafer to the CMOS driver wafer. The methods may further include forming a contact to a driver in the CMOS driver wafer after bonding the CMOS driver wafer and the LED wafer.

Embodiments of the present disclosure may allow for the formation of an IC microdisplay structure using conventional semiconductor manufacturing techniques without affecting the integrity of the drivers and subpixels. Embodiments of the present disclosure may also allow for the formation of compact subpixels and drivers in an IC microdisplay structure.

Embodiments of the disclosure as described herein may incorporate an oxide layer. The oxide layer may be formed, for example, as a passivating or cover layer on the surface of a metal layer to protect and prevent the metal layer from corroding. In other non-limiting examples, the oxide layer may be formed as an isolation layer, insulating layer, etc. The oxide layer may be formed, for example, from silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. The oxide layer may be formed, for example, by deposition and/or any other now known or later developed semiconductor manufacturing technique for forming an oxide layer. The oxide layer may include, for example, a thickness based on the technology node. For example, in the embodiments of the disclosure described herein, oxide layer may include a thickness of approximately 0.25 micrometers to approximately 0.5 micrometers.

Figure 2A:
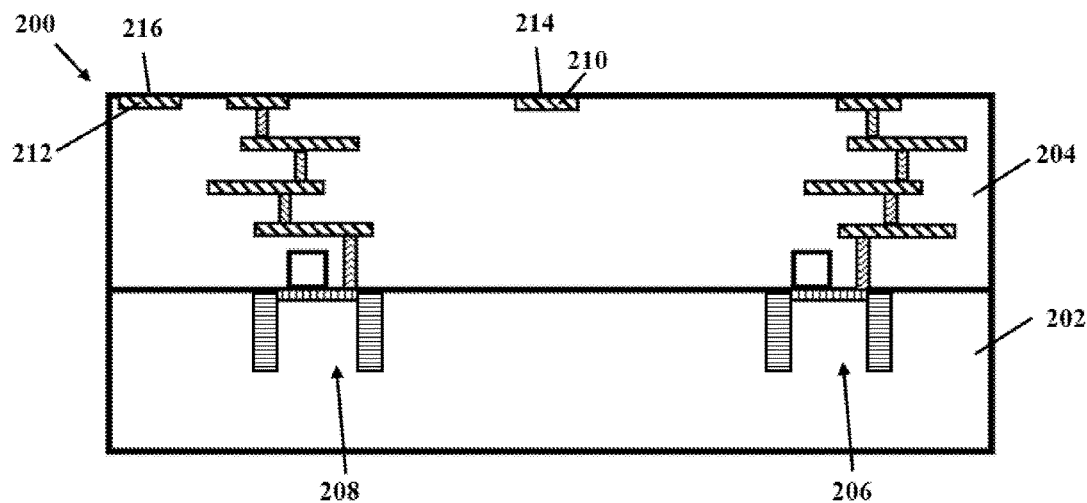
FIGS. 2a and 2b show CMOS driver wafers, according to the prior art.
Figure 2B:
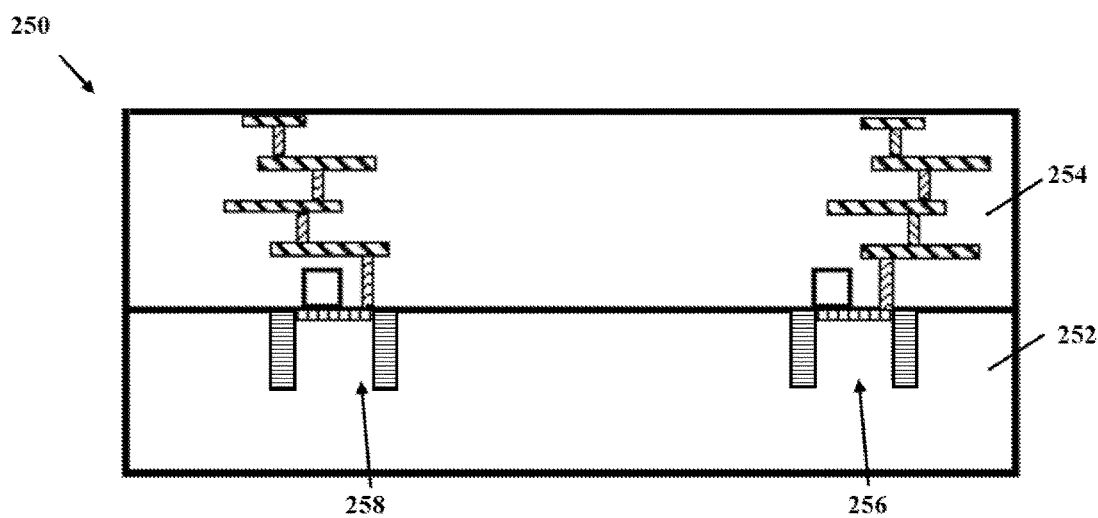

Referring to the drawings, FIGS. 1, 2a and 2b show an LED wafer 100 and CMOS driver wafers 200,250, according to the prior art.

As shown in FIG. 1, LED wafer 100 may include a buffer layer 104 on a substrate 102. LED wafer 100 may also include a gallium nitride (GaN) semiconductor layer 106 on the buffer layer. GaN semiconductor layer 106 may include, for example, an undoped GaN (iGaN) layer 108, and an n-doped GaN (nGaN) layer 110. LED wafer 100 may also include subpixels 120 formed from and extending vertically from nGaN layer 110. LED wafer 100 may also include a p-doped GaN (pGaN) layer 112 formed on a surface 122 and sidewalls 125 of subpixels 120. LED wafer 100 may also include a barrier layer 114 on nGaN layer 110, disposed between subpixels 120.

Substrate 102 may include, for example, silicon, silicon carbide, sapphire, and/or any other now known or later developed material for a substrate of an LED wafer. Buffer layer 104 may include, for example, aluminum nitride, and/or any other now known or later developed materials for buffer layers. Buffer layer 104 may be formed on substrate 102, for example, by deposition and/or any other now known or later developed semiconductor manufacturing technique for forming a buffer layer. nGaN layer 110, iGaN layer 108 and nGaN layer 110 may be formed, for example, by epitaxial growth, metalorganic chemical vapor deposition (MOCVD) and/or any other now known or layer developed semiconductor manufacturing method for forming a GaN layer. Although GaN semiconductor layer 106 is shown to include one iGaN and one nGaN layer, GaN semiconductor layer 106 may include any desirable number and any type of GaN layers for an LED fabrication. Subpixels 120 may be formed, for example, by forming an opening (not labeled) in barrier layer 114 and epitaxially growing nGaN layer 110 and/or any other now known or later developed semiconductor manufacturing process for forming subpixels. Barrier layer 114 may include, for example, silicon nitride (SiN) or silicon oxide ($SiO_2$) and/or any other now known or later developed barrier layer materials. Although only three subpixels 120 are shown, any desirable number of subpixels may be included in LED wafer 100.

Where materials are deposited, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

FIGS. 2a and 2b show CMOS driver wafers according to the prior art. As shown in FIGS. 2a and 2b, CMOS driver wafers 200,250 may include an oxide layer 204, 254 on a substrate 202, 252, respectively. CMOS driver wafers 200, 250 may also include a subpixel driver 206, 256 and/or input/output (I/O) driver 208,258, respectively. The drivers of each CMOS driver wafer may be laterally separated from one another in oxide layer 204, 254 and substrate 202, 252, respectively. Subpixel drivers 206, 256 may be electrically connected to subpixels 120 of LED wafer 100 to control the subpixels, for example, by regulating the current flowing to the subpixels. I/O drivers 208, 258 may be electrically connected to an external power supply (not shown) and control the current flowing to the IC microdisplay structure (e.g., IC microdisplay structures 600, 900 of FIGS. 6 and 9, respectively).

Substrate 202, 252 may include, for example, silicon, silicon carbide, silicon nitride, sapphire, and/or any other now known or later developed material for CMOS driver wafer.

Pixel driver 206,256 and I/O driver 208,258 may be formed, for example, by multi-step conventional lithography patterning, and/or any other now known or later semiconductor manufacturing technique for forming a driver. Although FIGS. 2a and 2b each show two drivers (a subpixel driver and an I/O driver) in each CMOS driver wafer 200,250, the CMOS driver wafers may include any number and type of drivers as may be desirable for an IC microdisplay structure.

FIG. 2a shows CMOS driver wafer 200 including voltage source (VSS) pads 210, 212. VSS pads 210, 212 may include, for example, metal pads for electrically connecting an IC microdisplay structure (e.g., IC microdisplay structures 600, 900 of FIGS. 6 and 9, respectively) and the components thereof to an external power supply (not shown). VSS pads 210, 212 may include exposed surfaces 214, 216 for forming electrical connections, respectively. VSS pad 212 may, for example, be configured to electrically connect an external power supply (not shown) to the IC microdisplay structure. Although not shown in FIG. 2a, VSS pad 210 may be electrically connected to VSS pad 212, for example, by structures of the CMOS driver wafer (e.g., metal wires) extending into the page of FIG. 2a. As discussed herein, VSS pad 210 may be electrically connected to subpixels 120 of LED wafer 100 for electrically connecting the LED wafer including subpixels 120 to the external power supply (not shown). In contrast to CMOS wafer 200 of FIG. 2a, FIG. 2b shows a CMOS driver wafer 250 without VSS pads.

VSS pads 210,212 shown in FIG. 2a may include, for example, copper, aluminum and/or any other now known or later developed materials for VSS pads. VSS pads 210, 212 may be formed by any now known or later developed semiconductor manufacturing techniques for forming a VSS. For example, VSS pads 210, 212 may be formed by etching (e.g., RIE) an opening (not labeled) in oxide layer 204 and depositing a metal in the opening. In another example, VSS pads 210, 212 may be formed by depositing a metal layer, patterning the metal layer, and depositing a fill material surrounding the patterned metal layer. Although FIG. 2a shows VSS pads 210,212 in a particular location in oxide layer 204, the VSS pads may be formed in any desirable location within the oxide layer as may be desirable for an IC microdisplay structure. Although FIG. 2a shows two VSS pads 210,212 in CMOS driver wafer 200, the CMOS driver wafer may include any number of VSS pads as may be desirable for an IC microdisplay structure.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

As discussed above, one conventional method of forming a microdisplay structure includes forming the structures of LED wafer 100 on the structures of CMOS driver wafer 200 or CMOS driver wafer 250 where the drivers are formed from polysilicon. In another method of conventional microdisplay formation, the subpixels of LED wafer 100 may be formed in an integrated circuit (IC) structure adjacent to pre-formed CMOS driver(s) and/or VSS pad(s) similar to those shown in CMOS driver wafers 200,250 of FIGS. 2a and 2b. In another conventional method of microdisplay formation, a CMOS driver(s) and/or VSS pad(s) would be formed in an IC structure adjacent to pre-formed subpixels (e.g., subpixels 120 of FIG. 1). Once the CMOS driver and LED subpixels are formed by the above described methods, the subpixels of the LED subpixels may then be electrically connected to the CMOS driver to form an IC microdisplay structure. Finally, in another conventional method of microdisplay formation, an LED chip and a CMOS driver chip formed from LED wafer 100 and CMOS driver wafer 200 or CMOS driver wafer 250, respectively, may be bonded and electrically connected via electrical connectors formed between the wafers.

As discussed above, conventional methods including forming the LED wafer over the CMOS driver in the IC structure generally involves the use of polysilicon in the formation of the CMOS driver and may require a processing conditions which are different from the conditions required for the remainder of the IC or conventional silicon CMOS drivers. Additionally, as discussed above, conventional methods including the formation of the subpixels adjacent to and before/after the formation of the CMOS driver may affect the functionality of the subpixels or the CMOS driver as a result of the differing processing conditions (e.g., temperature) required for each. Finally, conventional methods including bonding and electrically connecting the chips with conventional electrical connectors may result in the expansion of the connectors due to the temperature during bonding of the wafers and therefore result in electrical failures of the microdisplay.

In contrast to the conventional IC microdisplay structure formation methods discussed above, FIG. 3 shows processing LED wafer 100 for assembling LED wafer 100 to CMOS driver wafer 200 or CMOS driver wafer 250 for an IC microdisplay structure 600, 900 (see FIGS. 6 and 9), respectively, according to embodiments of the disclosure.

Figure 3:
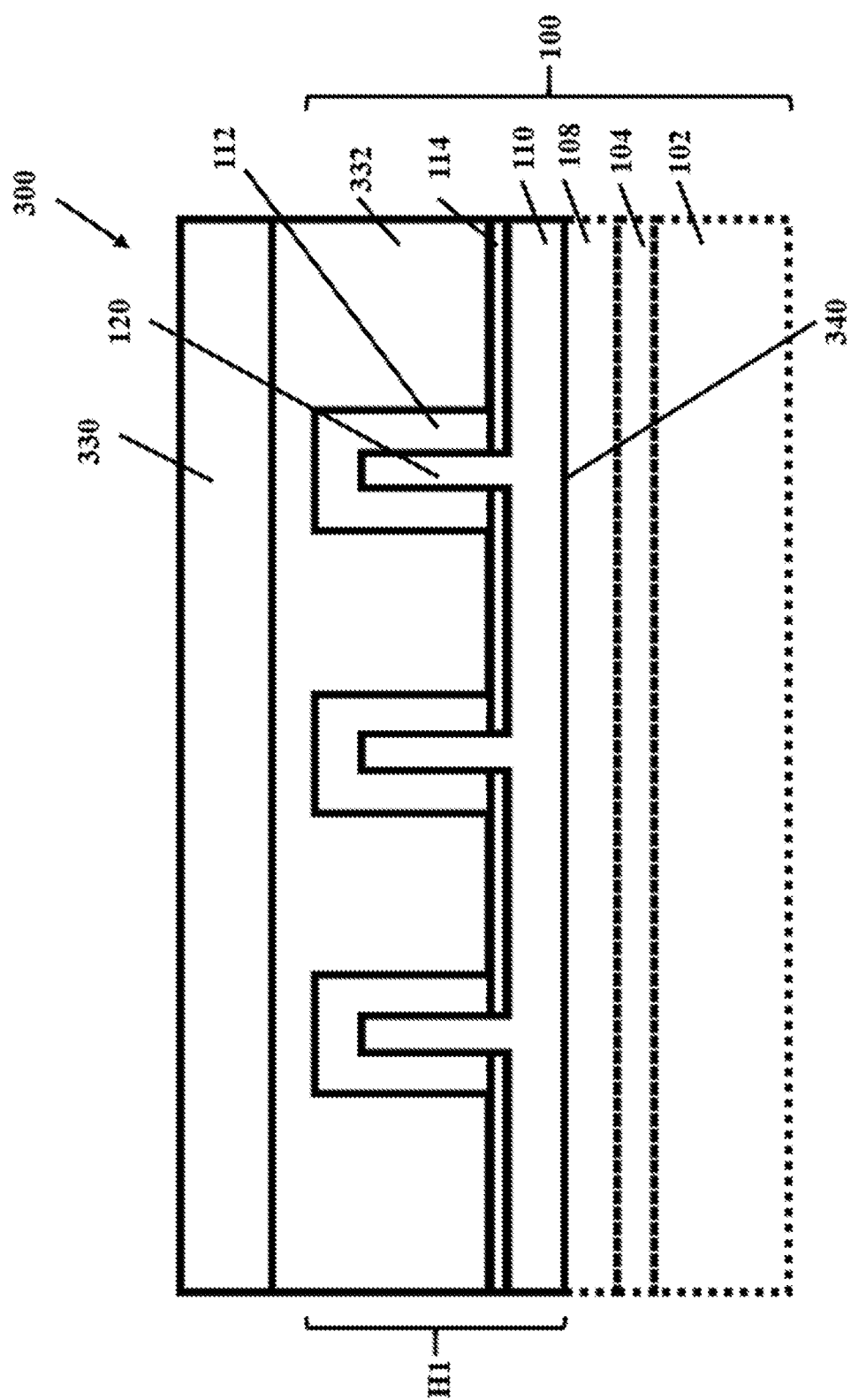
FIG. 3 shows bonding a carrier wafer to the LED wafer and exposing a surface of the nGaN layer of the LED wafer according to embodiments of the disclosure.

As shown in FIG. 3, a carrier substrate 330 may be attached to LED wafer 100 of FIG. 1. Carrier substrate 330 may be attached to LED wafer 100, for example, for ease of handling during processing of LED wafer 100. Carrier substrate 330 may be attached to LED wafer 100 by any now known or later developed semiconductor manufacturing techniques for attaching a carrier substrate. As shown in the example of FIG. 3, carrier substrate 330 may be attached to LED wafer 100, for example, by forming a dielectric layer 332 on LED wafer 100, including barrier layer 114 and pGaN layer 112, and attaching carrier substrate 330 to dielectric layer 332.

Dielectric layer 332 may include, but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), other low dielectric constant (<3.9) material, or layers thereof. Dielectric layer 332 may be formed by deposition and/or any other now known or later developed semiconductor manufacturing techniques for forming a dielectric layer. Dielectric layer 332 may, for example, be further processed after formation. For example, dielectric layer 332 may be polished before attaching carrier substrate 330 thereto.

Carrier substrate 330 may include, for example, silicon, glass and/or any other now known or layer developed material for a carrier substrate. Carrier substrate 330 may, for example, be polished before attaching the carrier wafer to dielectric layer. Carrier substrate 330 may be attached to dielectric layer 332, for example, by thermal bonding or ultraviolet (UV) bonding process using thermoplastics, polyimide (PI), silicon elastomer and/or any other now known or later developed semiconductor manufacturing techniques for attaching a carrier substrate to a dielectric layer.

As shown in phantom in FIG. 3, substrate 102, buffer layer 104, and iGaN layer 108 may be removed from LED wafer 100 before assembling LED wafer 100 and CMOS driver wafer 200 (FIG. 2a) or CMOS driver wafer 250 (FIG. 2b). Substrate 102, buffer layer 104, and iGaN layer 108 may be removed from LED wafer 100, for example, to expose a surface 340 of nGaN layer 106 for assembling CMOS driver wafer 200 or CMOS driver wafer 250 with LED wafer 100. Substrate 102, buffer layer 104, and iGaN layer 108 may be removed from LED wafer 100, for example by polishing and/or any other now known or later developed semiconductor manufacturing processes for removing the materials of the layers. Surface 340 of nGaN layer 106 may be further processed, for example, surface 340 may be polished before assembling the CMOS driver wafer and LED wafer for the IC microdisplay structure.

Figure 4:
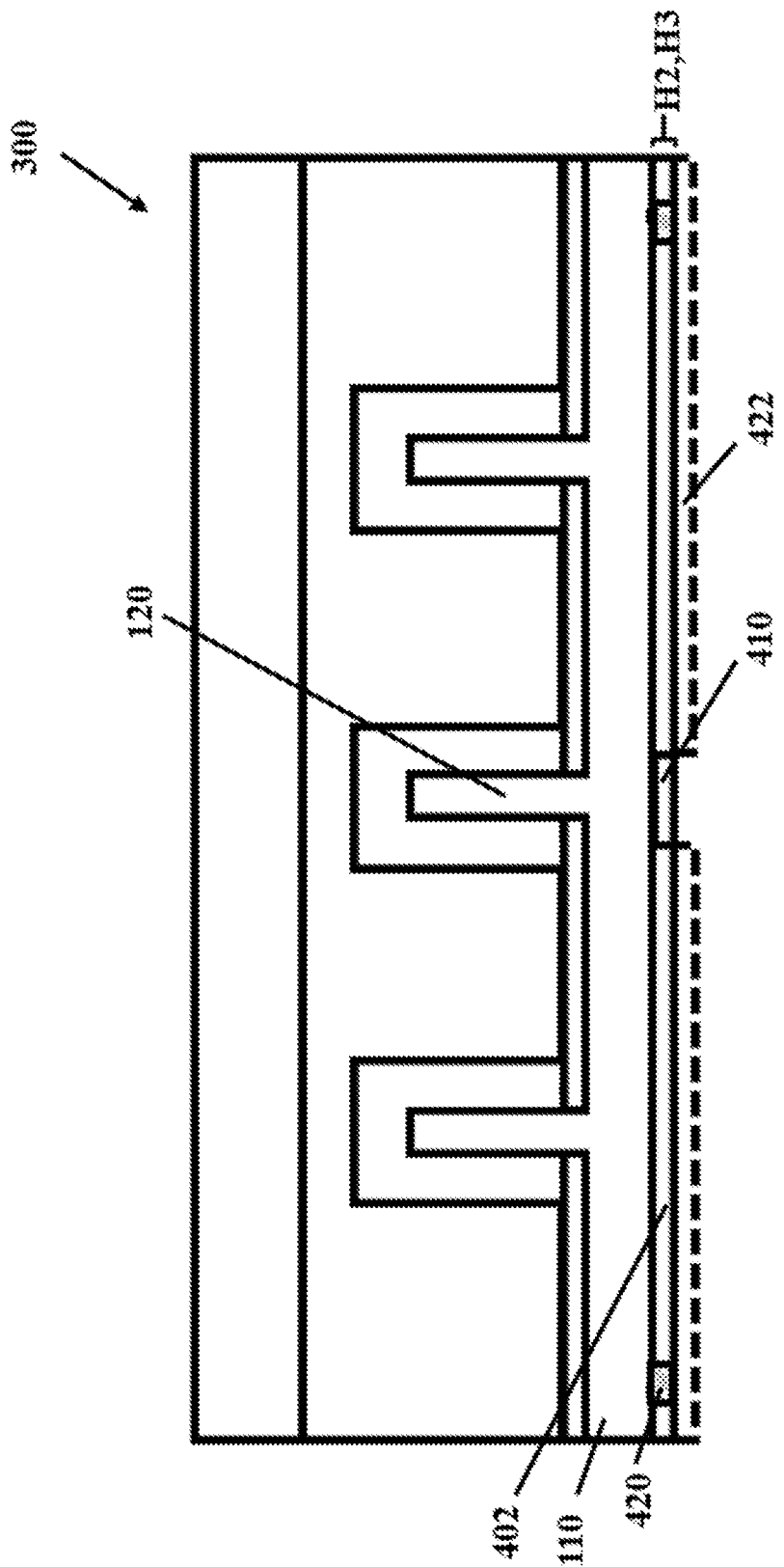
FIG. 4 shows forming an oxide layer and first conductive connector on the LED wafer of FIG. 3, according to embodiments of the disclosure.
Figure 5:
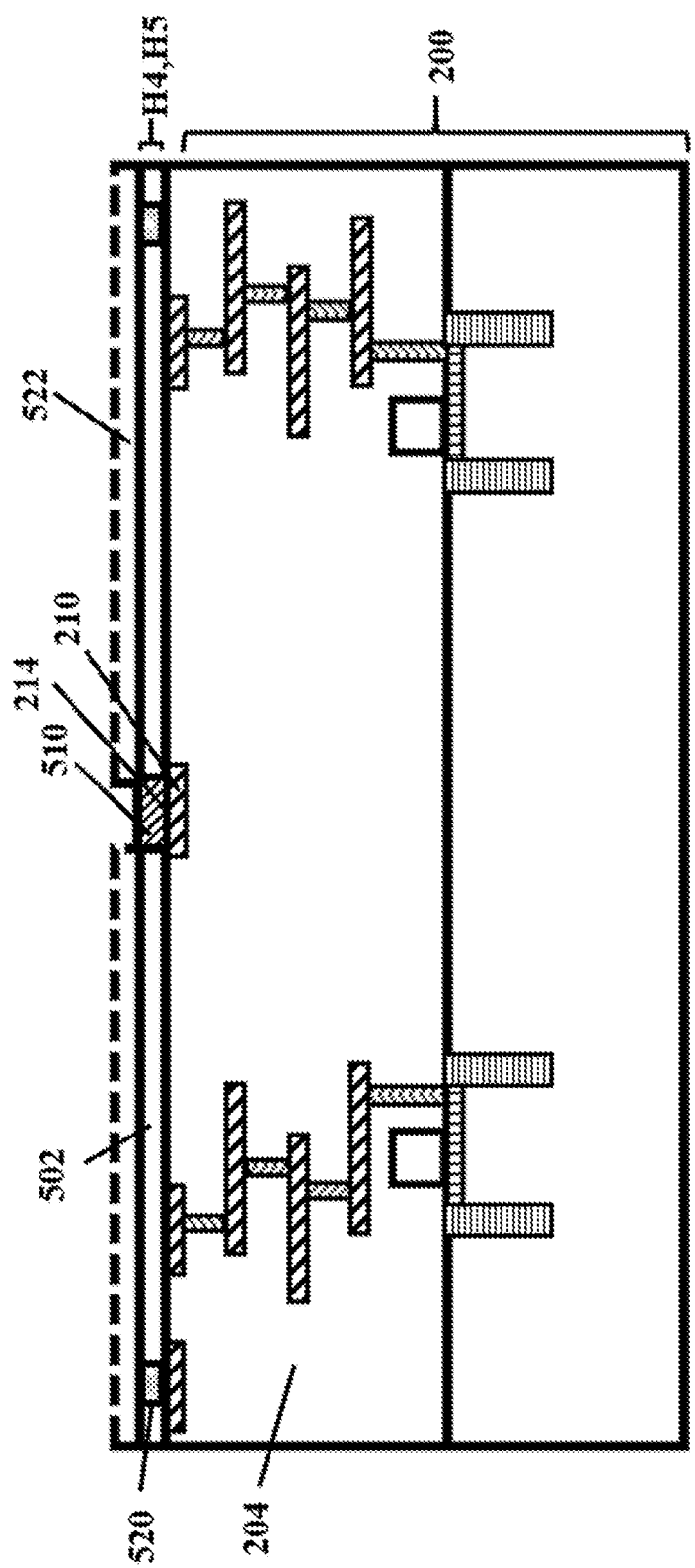
FIG. 5 shows forming an oxide layer and second conductive connector on the CMOS driver wafer of FIG. 2a, according to embodiments of the disclosure.
Figure 6:
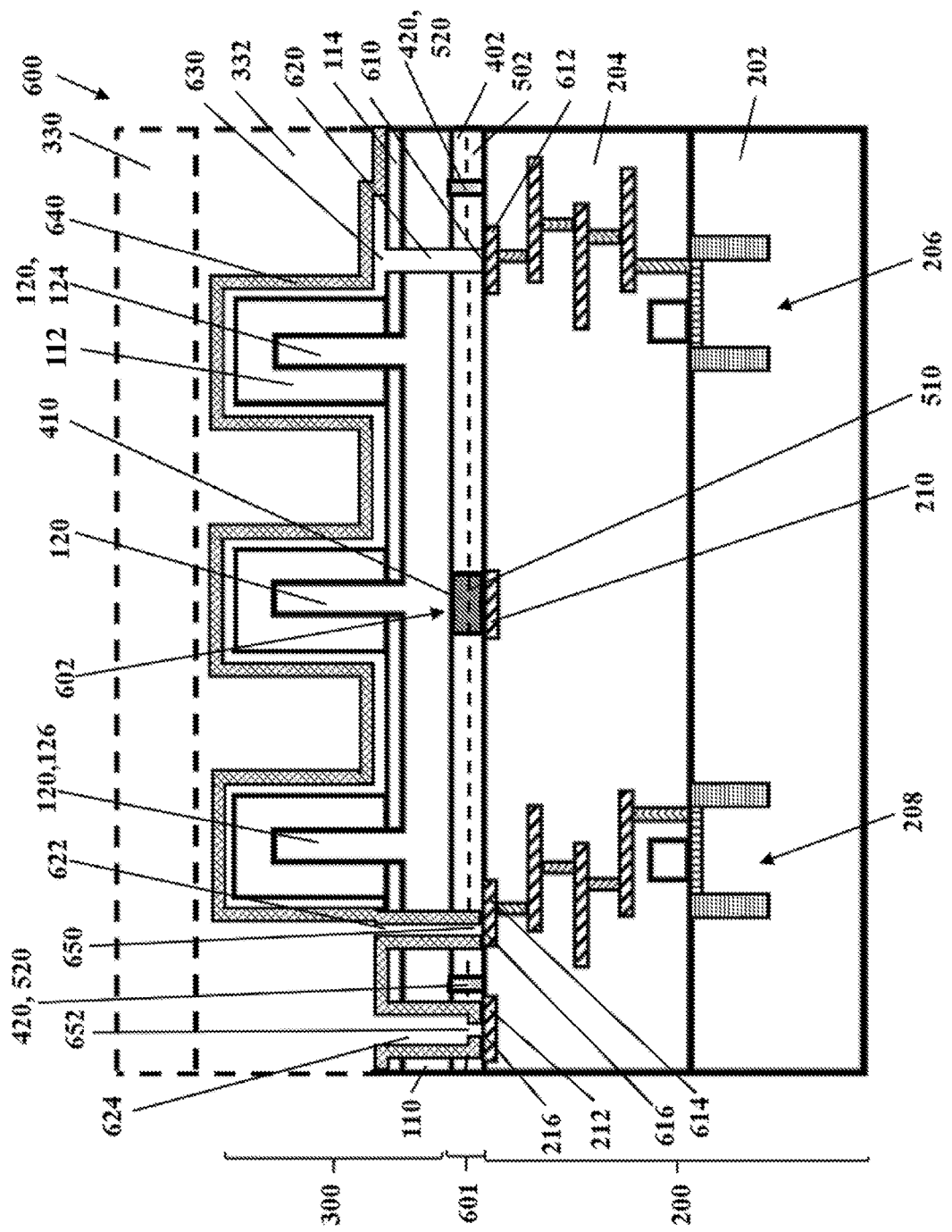
FIG. 6 shows assembling and electrically connecting the LED wafer of FIG. 4 and the CMOS driver wafer of FIG. 5, according to embodiments of the disclosure.

In contrast to conventional IC microdisplay structure manufacturing, FIGS. 4-6 show assembling LED wafer 100 to CMOS driver wafer 200 to form IC microdisplay structure 600 where the CMOS driver wafer includes VSS pads (e.g., VSS pads 210, 212), according to embodiments of the disclosure. Assembling LED wafer 100 with CMOS driver wafer 200 may include electrically connecting VSS pad 210 to subpixel(s) 120 during a bonding of the wafers to one another. Further, FIG. 6 shows forming openings for subsequently electrically connecting VSS pad 212 and I/O driver 208 of IC microdisplay structure 600 to an external power supply (not shown)

FIG. 4. shows forming an oxide layer 402 and first conductive connector 410 on LED wafer 300 of FIG. 3 for assembling CMOS driver wafer 200 and LED wafer 300. Oxide layer 402 may be formed on nGaN layer 110 of LED wafer 300. As shown in FIG. 4, first conductive connector 410 may be positioned in oxide layer 402 such that first conductive connector is in electrical communication with nGaN layer 110 for connecting VSS pad 210 of CMOS driver wafer 200 (see FIG. 2a) to subpixels 120 of LED wafer 300.

Oxide layer 402 may include, for example, a thickness H2. Oxide layer 402 may include, for example, alignment features 420 for aligning CMOS driver wafer 200 (see FIG. 5) with LED wafer 300 and first conductive connector 410 with second conductive connector 510 (see FIG. 5) during assembly of the wafers. Alignment features 420 may be formed, for example, by etching the oxide layer and/or any other now known or later developed methods for forming alignment features in an oxide layer.

First conductive connector 410 may be formed, for example, from copper and/or any other now known or later developed desirable conductive materials. First conductive connector 410 may include, for example, a thickness H3 of approximately 0.25 micrometers (μm) to approximately 0.5 μm. The thickness H3 of first conductive connector 410 may vary, for example, with technology nodes. First conductive connector 410 may be formed, for example, by etching (e.g., by RIE) an opening (not labeled) in oxide layer 402 using mask 422 (in phantom) and depositing a conductor in the opening. Mask 422 (in phantom) may be removed, for example, after forming the opening in oxide layer 402 or after the forming of first conductive connector 410 in the opening. Mask 422 (in phantom) may be removed, for example, by conventional semiconductor manufacturing techniques for removing a mask. First conductive connector 410 may also be formed, for example, by any other now known or later developed semiconductor manufacturing processes for forming a conductive connector in an oxide layer.

FIG. 5 shows forming shows forming an oxide layer 502 and second conductive connector 510 on CMOS driver wafer 200 for assembling CMOS driver wafer 200 and LED wafer 300 of FIG. 4. Oxide layer 502 may be formed on oxide layer 204 of CMOS driver wafer 200 of FIG. 2a. As shown in FIG. 5, second conductive connector 510 may be positioned in oxide layer 502 on surface 214 of VSS pad 210 of CMOS driver wafer 200 of FIG. 2a. Second conductive connector 510 may be positioned in electrical communication with VSS pad 210 for connecting VSS pad 210 to subpixels 120 of LED wafer 300 (see FIG. 4).

Oxide layer 502 may include, for example, a thickness H4. Oxide layer 502 may include, for example, alignment features 520 matching alignment features 420 of LED wafer 300 of FIG. 4 for aligning CMOS driver wafer 200 with the LED wafer, and for aligning first conductive connector 410 (see FIG. 4) with second conductive connector 510 during assembly of the wafers. Alignment features 520 may be formed, for example, by etching the oxide layer and/or any other now known or later developed methods for forming alignment features in an oxide layer.

Second conductive connector 510 may be formed, for example, from copper and/or any other now known or later developed materials desirable for a conductive connector. Second conductive connector 510 may include, for example, a thickness H5 of approximately 0.25 micrometers (μm) to approximately 0.5 μm. Second conductive connector 510 may be formed, for example, by etching (e.g., by RIE) an opening (not labeled) in oxide layer 502 using mask 522 (in phantom) and depositing copper in the opening. Mask 522 (in phantom) may be removed, for example, after forming the opening in oxide layer 502 or after the forming of second conductive connector 510 in the opening. Mask 522 (in phantom) may be removed, for example, by conventional semiconductor manufacturing techniques for removing a mask. Second conductive connector 510 may also be formed, for example by any other now known or later developed semiconductor manufacturing processes for forming a conductive connector in an oxide layer.

FIG. 6 shows assembling CMOS driver wafer 200 and LED wafer 100 to form IC microdisplay structure 600, according to embodiments of the disclosure. FIG. 6 also shows electrically connecting VSS pad 210 to subpixels 120 during assembly of CMOS driver wafer 200 and LED wafer 300 for IC microdisplay structure 600, according to embodiments of the disclosure. FIG. 6 also shows electrically connecting subpixel(s) 120 to subpixel driver 206, and forming contact openings 622, 624 for forming contacts to electrically connect I/O driver 208 and VSS pad 212 to an external power supply (not shown), respectively, for electrically connecting IC microdisplay structure 600, according to embodiments of the disclosure.

CMOS driver wafer 200 and LED wafer 300 may be assembled, for example, by bonding oxide layer 402 with oxide layer 502. CMOS driver wafer 200 and LED wafer 300 may, for example, be aligned with one another before being bonded, for example, using alignment features 420, 520. Oxide layer 402 and oxide layer 502 may be bonded, for example, by fusion bonding, and/or any other now known or later developed semiconductor manufacturing techniques for bonding oxide layers to one another. Oxide layer 402 and oxide layer 502 may, for example, form single oxide layer 601 after the layers are bonded.

VSS pad 210 may be electrically connected to subpixels 120, for example, by bonding first conductive connector 410 with second conductive connector 510 during the bonding of oxide layer 402 to oxide layer 502. First conductive connector 410 and second conductive connector 510 may be bonded, for example, by fusion bonding and/or any other now known or later developed techniques for forming a bond between conductive connectors. First conductive connector 410 and second conductive connector 510 may, for example, form a metal pillar 602 after being bonded. Metal pillar 602 may electrically connect VSS pad 210 to subpixels 120 of nGaN layer 110.

Carrier substrate 330 (in phantom) and dielectric layer 332 (in phantom) may be removed from LED wafer 300 after LED wafer 300 and CMOS driver wafer 200 have been bonded to one another, as discussed above. Carrier substrate 330 and dielectric layer 332 may be removed by etching and/or any other now known or later developed semiconductor manufacturing technique for removing a substrate and dielectric layer.

As shown in the example of FIG. 6, subpixels 120 may be electrically connected to subpixel driver 206 after bonding LED wafer 300 and CMOS driver wafer 200. Contact openings (e.g., contact openings 620, 622, 624) may be formed, for example, through barrier layer 114, nGaN layer 110 and single oxide layer 601 to pixel driver 206, I/O driver 208, VSS pad 212 and/or any other component of an IC microdisplay structure which may need electrical connections. For example, contact opening 620 may be formed to expose a surface 610 of a metal wire 612 of subpixel driver 206 in oxide layer 204. Contact opening 622 may be formed, for example, to expose a surface 614 of a metal wire 616 of I/O driver 208 in oxide layer 204. Contact opening 624 may be formed, for example, to expose surface 216 of VSS pad 212 in oxide layer 204. Contact openings 620, 622, 624 may be formed, for example, by etching and/or any other now known or later developed semiconductor manufacturing techniques for forming a contact opening.

Although not shown for the purpose of simplicity, spacers may be formed, for example, on the sidewalls of contact openings 620, 622, 624 and pGaN layer 112 on the sidewalls of subpixels 120. The spacers formed on pGaN layer 112 are neither essential nor necessary and may be optionally removed after formation and before further processing. The spacers may include, for example, oxide and/or any other now known or later developed materials desirable for spacers. The spacers may be formed, for example, by deposition and/or any other now known or later developed semiconductor manufacturing technique for forming spacers. The spacers may be removed, for example, by dry etching and/or any other now known or later developed semiconductor manufacturing techniques for removing spacers.

As shown in FIG. 6, an electrically conductive layer 630 may be formed to electrically connect subpixel driver 206 and subpixels 120. Electrically conductive layer 630 may be formed, for example, over barrier layer 114, pGaN layer 112 and in contact opening 620 on surface 610 of metal wire 612 of subpixel driver 206. Although not shown, where spacers have been formed and remain on pGaN layer 112 on the sidewalls of subpixels 120, and on the sidewalls of contact opening 620, electrically conductive layer 630 may also be formed on the sidewall spacers. Electrically conductive layer 630 may include indium tin oxide, and/or any other now known or later developed optically transparent material for an electrical conductive layer. Electrically conductive layer 630 may be formed, for example by deposition, and/or any other now known or later developed semiconductor manufacturing technique for forming an electrically conductive layer.

As shown in FIG. 6, a dielectric encapsulation layer 640 may be formed to electrically insulate portions of IC microdisplay structure 600. Dielectric encapsulation layer 640 may be formed, for example, over electrically conductive layer 630, remaining exposed portions of barrier layer 114 and/or in contact openings 622, 624. Although not shown, where spacers have been formed on the sidewalls of contact openings 622, 624, dielectric encapsulation layer 640 may be formed on the spacers. Dielectric encapsulation layer 640 may include, for example, silicon nitride, silicon dioxide and/or any other now known or later developed materials desirable for a dielectric encapsulation layer.

As shown in FIG. 6, openings (e.g., openings 650, 652) may be formed to VSS pad 212, I/O driver 208, and/or any other component of IC microdisplay structure which may be electrically connected to an external power supply (not shown). For example, opening 650 may be formed by etching (e.g., RIE) through dielectric encapsulation layer 640 to expose surface 614 of metal wire 616 of I/O driver 208 for further processing for forming an electrical connection (not shown) to an external power supply (not shown). Opening 652 may be formed by etching (e.g., RIE), for example, through dielectric encapsulation layer 640 to expose surface 216 of VSS pad 212 for further processing for forming an electrical connection (not shown) to an external power supply (not shown).

As shown in FIG. 6, after bonding CMOS driver wafer 200 and LED wafer 300, a portion of pixel driver 206 and/or I/O driver 208 may be vertically aligned with a subpixel 120 of LED wafer 300. For example, a portion of pixel driver 206 may be aligned with subpixel 124 and/or a portion of I/O driver 208 may be aligned with subpixel 126. Although approximately half of pixel driver 206 and I/O driver 208 are shown to be vertically aligned with a portion of each subpixels, any desirable portion and/or all of a driver may be vertically aligned with any portion of any number of subpixels.

Once LED wafer 300 and CMOS driver wafer 200 have been assembled and electrically connected to form IC microdisplay structure 600, the IC microdisplay structure may undergo additional conventional processing. For example, contacts may be formed in openings 650, 652 and wires connected thereto to electrically connect the IC microdisplay structure to an external power supply (not shown).

Figure 7:
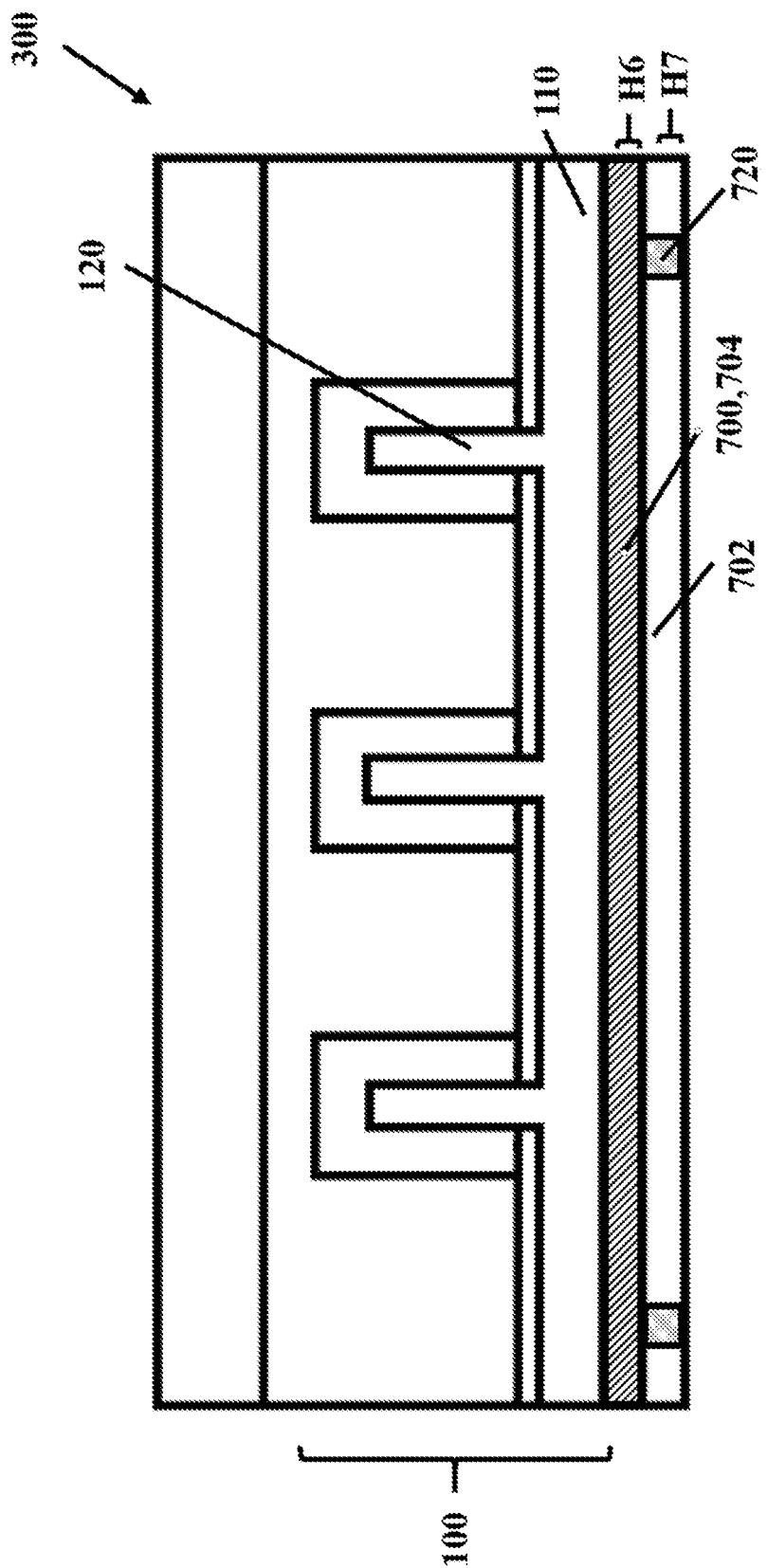
FIG. 7 shows forming a VSS pad and an oxide layer on the LED wafer of FIG. 3, according to embodiments of the disclosure.
Figure 8:
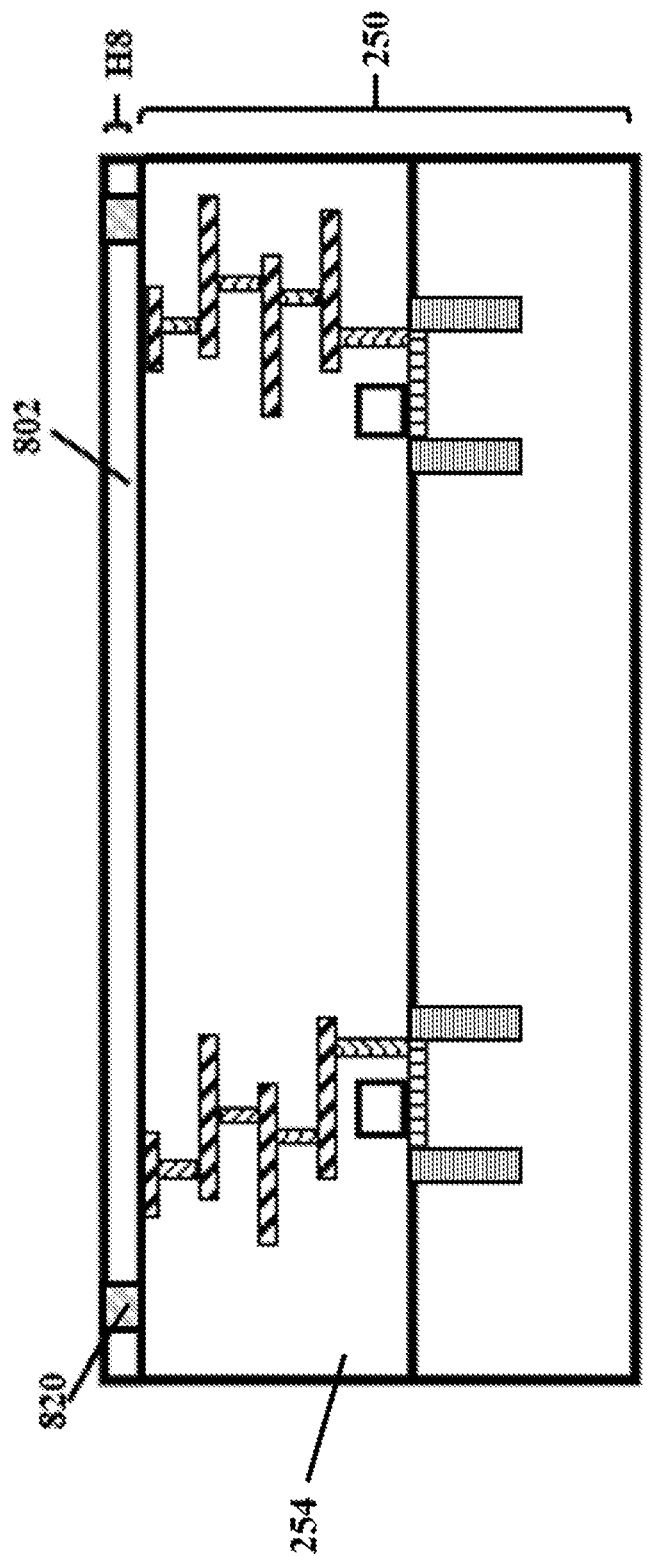
FIG. 8 shows forming an oxide layer on the CMOS driver wafer of FIG. 2b, according to embodiments of the disclosure.
Figure 9:
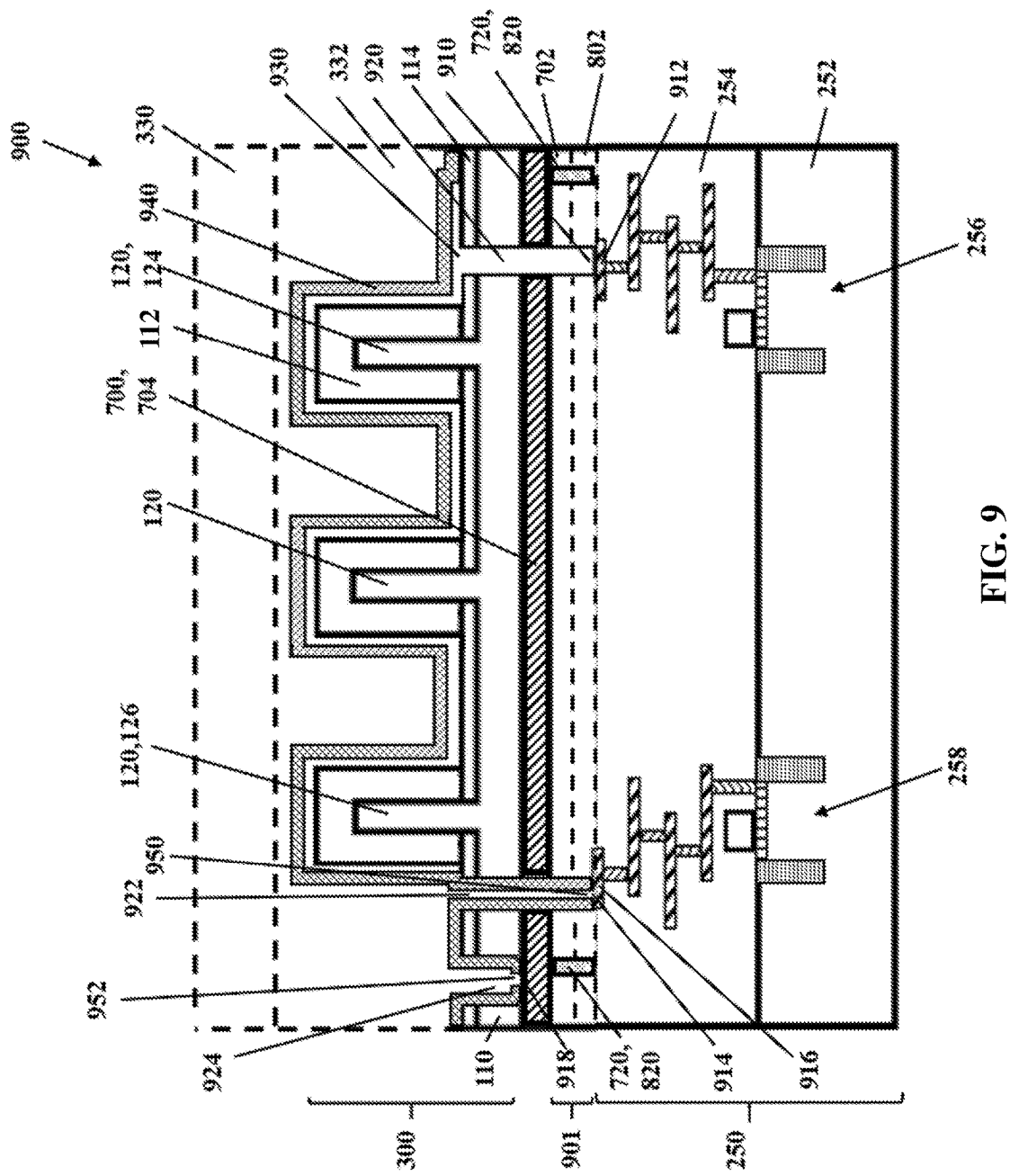
FIG. 9 shows assembling and electrically connecting the LED wafer of FIG. 7 and the CMOS driver wafer of FIG. 8, according to embodiments of the disclosure.

In contrast to conventional IC microdisplay structure manufacturing, FIGS. 7-9 show assembling LED wafer 300 of FIG. 3 to CMOS driver wafer 250, for an IC microdisplay structure 900, according to embodiments of the disclosure. In contrast to the assembly of LED wafer 300 and CMOS driver wafer 200 shown in FIGS. 4-6, CMOS driver wafer 250 does not include VSS pads. Therefore, as shown in FIG. 7, the assembly may include, for example, forming a VSS pad 700, in the form of a metal layer 704, on LED wafer 300 of FIG. 3 for electrically connecting IC microdisplay structure 900 including subpixels 120, to an external power supply (not shown). As also shown in FIG. 7, the assembly may also include, for example, forming an oxide layer 702 on VSS pad 700 for bonding the LED wafer to CMOS driver wafer 250. As shown in FIG. 8, assembling LED wafer 300 with CMOS driver wafer 250 may include, for example, forming an oxide layer 802 for bonding the LED wafer and the CMOS driver wafer. As shown in FIG. 9, assembling LED wafer 300 with CMOS driver wafer 250 may also include, bonding the wafers to one another after forming VSS pad 700. Further, FIG. 9 shows forming openings for subsequently electrically connecting VSS pad 700 and I/O driver 258 of IC microdisplay structure 900 to an external power supply (not shown).

Returning to FIG. 7., forming a VSS pad 700 and oxide layer 702 on LED wafer 300 of FIG. 3 for assembling CMOS driver wafer 250 (see FIG. 2b) and LED wafer 300 are shown. VSS pad 700 may be formed on nGaN layer 110 of LED wafer 300. As shown in FIG. 7, VSS pad 700 may, for example, include a metal layer 704. VSS pad 700 may be electrically connected to subpixels 120 by forming the VSS pad in electrical communication with nGaN layer 110. As will be discussed herein, VSS pad 700 may also be subsequently electrically connected to an external power supply (not shown). As shown in FIG. 7, oxide layer 702 may be formed on VSS pad 700 for bonding LED wafer 300 to CMOS driver wafer 250 (see FIG. 2b).

VSS pad 700/metal layer 704 may include, for example, aluminum, copper, tungsten, and/or any other now known or later developed material for a VSS pad. VSS pad 700/metal layer 704 may include, for example, a thickness H6 of approximately 0.25 μm to approximately 0.5 μm. VSS pad 700/metal layer 704 may be formed, for example, by deposition and/or any other now known or later developed semiconductor manufacturing techniques for forming a VSS pad/metal layer.

Oxide layer 702 may include, for example, a thickness H7. Oxide layer 702 may include, for example, alignment features 720 for aligning CMOS driver wafer 250 (see FIG. 8) with LED wafer 300 during assembly of the wafers. Alignment features 720 may be formed, for example, by etching the oxide layer and/or any other now known or later developed methods for forming alignment features in an oxide layer.

FIG. 8 shows forming an oxide layer 802 on oxide layer 254 of CMOS driver wafer 250 for assembling CMOS driver wafer 250 and LED wafer 300 (see FIG. 7). Oxide layer 802 may be formed on oxide layer 254 of CMOS driver wafer 250 of FIG. 2b. Oxide layer 802 may include, for example, a thickness H8. Oxide layer 802 may include, for example, alignment features 820 aligned with alignment features 720 of oxide layer 702 of LED wafer 300 (see FIG. 7) for aligning CMOS driver wafer 250 with LED wafer 300 (see FIG. 7) during assembly of the wafers. Alignment features 820 may be formed, for example, by etching oxide layer 802 and/or any other now known or later developed methods for forming alignment features in an oxide layer.

FIG. 9 shows assembling CMOS driver wafer 250 and LED wafer 300 to form IC microdisplay structure 900, according to embodiments of the disclosure. FIG. 9 also shows electrically connecting subpixel(s) 120 to subpixel driver 206. FIG. 9 also shows forming openings 950, 952 for forming contacts to electrically connect I/O driver 208 and VSS pad 700 to an external power supply (not shown), respectively, for electrically connecting IC microdisplay structure 900, according to embodiments of the disclosure.

CMOS driver wafer 250 and LED wafer 300 may be assembled, for example, by bonding oxide layer 702 with oxide layer 802. CMOS driver wafer 250 and LED wafer 300 may, for example, be aligned with one another before being bonded, for example, using alignment features 720, 820. Oxide layer 702 and oxide layer 802 may be bonded, for example, by fusion bonding, and/or any other now known or later developed semiconductor manufacturing techniques for bonding oxide layers to one another. Oxide layer 702 and oxide layer 802 may, for example, form single oxide layer 901 after the layers are bonded.

Carrier substrate 330 (in phantom) and dielectric layer 332 (in phantom) may be removed from LED wafer 300 after LED wafer 300 and CMOS driver wafer 250 have been bonded to one another, as discussed above. Carrier substrate 330 and dielectric layer 332 may be removed by etching and/or any other now known or later developed semiconductor manufacturing technique for removing a substrate and dielectric layer.

As shown in the example of FIG. 9, subpixels 120 may be electrically connected to subpixel driver 256 after bonding LED wafer 300 and CMOS driver wafer 250. Contact openings (e.g., contact openings 920, 922, 924) may be formed by etching (e.g., RIE), for example, through barrier layer 114, nGaN layer 110, VSS pad 700/metal layer 704 and/or single oxide layer 901 to pixel driver 256, I/O driver 258, VSS pad 700 and/or any other component of an IC microdisplay structure which may need electrical connections. For example, contact opening 920 may be formed to expose a surface 910 of a metal wire 912 of subpixel driver 256 in oxide layer 254. Contact opening 922 may be formed, for example, to expose a surface 914 of a metal wire 916 of I/O driver 258 in oxide layer 254. Contact opening 924 may be formed, for example, to expose surface 918 of VSS pad 700. Contact openings 920, 922, 924 may be formed, for example, by etching and/or any other now known or later developed semiconductor manufacturing techniques for forming a contact opening.

Although not shown for the purpose of simplicity, spacers may be formed, for example, on the sidewalls of contact openings 920, 922, 924 and pGaN layer 112 on the sidewalls of subpixels 120. The spacers formed on pGaN layer 112 are neither essential nor necessary and may be optionally removed after formation and before further processing. The spacers may include, for example, oxide and/or any other now known or later developed materials desirable for spacers. The spacers may be formed, for example, by deposition and/or any other now known or later developed semiconductor manufacturing technique for forming spacers. The spacers may be removed, for example, by dry etching and/or any other now known or later developed semiconductor manufacturing techniques for removing spacers.

As shown in FIG. 9, an electrically conductive layer 930 may be formed to electrically connect subpixel driver 256 and subpixels 120. Electrically conductive layer 930 may be formed, for example, over barrier layer 114, pGaN layer 112 and in contact opening 920 on surface 910 of metal layer 912 of subpixel driver 256. Although not shown, where spacers have been formed and remain on pGaN layer 112 on the sidewalls of subpixels 120, and/or the sidewalls of contact opening 920, electrically conductive layer 930 may also be formed on the sidewall spacers. Electrically conductive layer 930 may include, for example, indium tin oxide, and/or any other now known or later developed optically transparent material for an electrical conductive layer. Electrically conductive layer 930 may be formed, for example by deposition, and/or any other now known or later developed semiconductor manufacturing technique for forming an electrically conductive layer.

As shown in FIG. 9, a dielectric encapsulation layer 940 may be formed to electrically insulate portions of IC microdisplay structure 900. Dielectric encapsulation layer 940 may be formed, for example, over electrically conductive layer 930, remaining exposed portions of barrier layer 114 and/or in contact openings 922, 924. Although not shown, where spacers have been formed on the sidewalls of contact openings 922, 924, dielectric encapsulation layer 640 may be formed on the spacers. Dielectric encapsulation layer 940 may include, for example, silicon nitride, silicon dioxide and/or any other now known or later developed materials desirable for a dielectric encapsulation layer.

As shown in FIG. 9, openings (e.g., openings 950, 952) may be formed to VSS pad 212, I/O driver wafer 258, and/or any other component of IC microdisplay structure 900 which may be electrically connected to an external power supply (not shown). For example, opening 950 may be formed by etching (e.g., RIE) through dielectric encapsulation layer 940 to expose surface 914 of metal wire 916 of I/O driver 208 for further processing for forming an electrical connection (not shown) to an external power supply (not shown). Opening 952 may be formed by etching (e.g., RIE), for example, through dielectric encapsulation layer 940 to expose surface 918 of VSS pad 700 for further processing for forming an electrical connection (not shown) to an external power supply (not shown).

As shown in FIG. 9, after bonding CMOS driver wafer 250 and LED wafer 300, a portion of pixel driver 206 and/or I/O driver 258 may be vertically aligned with a subpixel 120 of LED wafer 300. For example, a portion of pixel driver 256 may be aligned with subpixel 124 and/or a portion of I/O driver 258 may be aligned with subpixel 126. Although approximately half of pixel driver 256 and I/O driver 258 are shown to be vertically aligned with a portion of each subpixels, any desirable portion and/or all of a driver may be vertically aligned with any portion of any number of subpixels.

Once LED wafer 300 and CMOS driver wafer 250 have been assembled and electrically connected to form IC microdisplay structure 900, the IC microdisplay structure may undergo additional conventional processing. For example, contacts may be formed in openings 950, 952 and wires attached thereto to electrically connect the IC microdisplay structure to an external power supply (not shown).

The method as described above may be used in the fabrication of integrated circuit chips for microdisplay systems. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) microdisplay structure comprising:
   a first oxide layer positioned on a substrate;
   a first voltage source (VSS) pad disposed on the substrate;
   a metal pillar disposed within the first oxide layer and on the first VSS pad;
   a first gallium nitride layer disposed on the metal pillar and extending over the first oxide layer; and
   at least one subpixel formed from and extending vertically from the first gallium nitride layer.

2. The IC microdisplay structure of claim 1, further comprising:
   a first driver within the first oxide layer and the substrate;
   a first opening extending through the first gallium nitride layer and the first oxide layer to the first driver; and
   a first conductive layer in the first opening and on the at least one subpixel, the first conductive layer electrically connecting the first driver to the at least one subpixel.

3. The IC microdisplay structure of claim 1, further comprising:
   a second driver within the first oxide layer and the substrate, the second driver laterally separated from the first driver; and
   a second VSS pad within the first oxide layer, the second VSS pad laterally separated from the first VSS pad, and wherein the second driver and the second VSS pad are in electrical communication with a power supply.

4. The IC microdisplay structure of claim 3, wherein at least a portion of the second driver is vertically aligned with a subpixel of the at least one subpixel.

5. The IC microdisplay structure of claim 1, wherein at least a portion of the first driver is vertically aligned with a subpixel of the at least one subpixel.

6. The IC microdisplay structure of claim 1, wherein the metal pillar includes copper.

7. The IC microdisplay structure of claim 1, wherein the metal pillar is vertically aligned with a subpixel of the at least one subpixel.

8. The IC microdisplay structure of claim 1, wherein a thickness of the metal pillar is approximately 0.5 micrometers to approximately 1 micrometer.

9. The IC microdisplay structure of claim 1, further comprising:
   an alignment feature disposed within the first oxide layer for aligning the first gallium nitride layer with the substrate.

10. The IC microdisplay structure of claim 1, further comprising:
    a barrier layer disposed on the first gallium nitride layer.

11. The IC microdisplay structure of claim 10, wherein the first gallium nitride layer includes n-doped gallium nitride.

12. The IC microdisplay structure of claim 11, wherein the at least one subpixel includes a plurality of subpixels and each subpixel of the plurality of subpixels includes a respective surface and sidewalls, the IC microdisplay structure further comprising:
    a gallium nitride covering disposed on the respective surface and sidewalls of each subpixel of the plurality of subpixels, wherein the gallium nitride covering includes p-doped gallium nitride.

* * * * *